(12) United States Patent
Wang et al.

(10) Patent No.: US 7,009,427 B1
(45) Date of Patent: Mar. 7, 2006

(54) LOW POWER DYNAMIC INVERTER LOGIC GATE WITH INVERTER-LIKE OUTPUT

(75) Inventors: Lei Wang, Sunnyvale, CA (US); Qiang Li, Fremont, CA (US); Jianbin Wu, Fremont, CA (US)

(73) Assignee: PicoNetics, Inc., Fremont, CA (US)

( * ) Notice: Subject to any disclaimer, the term of this patent is extended or adjusted under 35 U.S.C. 154(b) by 36 days.

(21) Appl. No.: 10/142,740

(22) Filed: May 8, 2002

Related U.S. Application Data

(63) Continuation-in-part of application No. 10/139,040, filed on May 3, 2002, now Pat. No. 6,693,462, and a continuation-in-part of application No. 10/087,604, filed on Mar. 1, 2002, now Pat. No. 6,552,574, and a continuation-in-part of application No. 09/967,189, filed on Sep. 27, 2001, now Pat. No. 6,559,681, and a continuation-in-part of application No. 09/614,494, filed on Jul. 11, 2000, now Pat. No. 6,448,816.

(51) Int. Cl.
*H03K 19/096* (2006.01)

(52) U.S. Cl. .......................................... 326/95; 326/119
(58) Field of Classification Search .................. 326/93, 326/95–98, 112, 119, 121
See application file for complete search history.

(56) References Cited

U.S. PATENT DOCUMENTS

| | | | |
|---|---|---|---|
| 4,017,741 A | 4/1977 | Briggs | 377/79 |
| 5,473,270 A | 12/1995 | Denker | 326/95 |
| 5,743,270 A * | 4/1998 | Gazzara et al. | 326/95 |
| 6,150,848 A | 11/2000 | Fouts et al. | 326/96 |
| 6,242,952 B1 * | 6/2001 | Bosshart et al. | 326/98 |

FOREIGN PATENT DOCUMENTS

JP          407249982 A        9/1995

* cited by examiner

*Primary Examiner*—James H. Cho
(74) *Attorney, Agent, or Firm*—Anthony B. Diepenbrock, III; Dechert LLP

(57) ABSTRACT

A low power dynamic circuit with an inverter-like output is disclosed. The dynamic circuit includes a precharge circuit, a discharge circuit, and an output circuit. The precharge circuit charges a precharge node from the clock signal when the data input signal is low and the clock input is high. The discharge circuit discharges a discharge node to the clock signal when the data input signal is high and the clock input is low. The output circuit is an inverter-like configuration that uses the precharge node to generate a logic high and the discharge node to generate a logic low, as required by the data input signal. In one embodiment, the precharge circuit is operative with a first clock and the discharge circuit is operative with a second clock. In yet another embodiment, there is only a precharge circuit and an output circuit.

14 Claims, 6 Drawing Sheets

LOW POWER DYNAMIC INVERTER LOGIC GATE WITH INVERTER-LIKE OUTPUT

CROSS-REFERENCE TO RELATED APPLICATIONS

This Application is a continuation-in-part of the following applications:

U.S. patent Ser. No. 09/967,189, entitled RESONANT LOGIC AND THE IMPLEMENTATION OF LOW POWER DIGITAL INTEGRATED CIRCUITS, filed Sep. 27, 2001, now U.S. Pat. No. 6,559,681, incorporated by reference into the present application and a continuation-in-part of the U.S. application Ser. No. 09/614,494;

U.S. patent application Ser. No. 09/614,494, entitled RESONANT LOGIC AND THE IMPLEMENTATION OF LOW POWER DIGITAL INTEGRATED CIRCUITS, filed Jul. 11, 2000, now U.S. Pat. No. 6,448,816;

U.S. patent application Ser. No. 10/139,040, entitled LOW POWER DYNAMIC LOGIC GATE WITH FULL VOLTAGE SWING AND TWO PHASE OPERATION, filed May 3, 2002, now U.S. Pat. No. 6,693,462, incorporated by reference into the present application and a continuation-in-part of U.S. application Ser. No. 10/087,604; and U.S. patent application Ser. No. 10/087,604, entitled LOW POWER DYNAMIC LOGIC GATE WITH FULL VOLTAGE SWING OPERATION, filed Mar. 1, 2002, now U.S. Pat. No. 6,552,574, incorporated by reference into the present application.

FIELD OF THE INVENTION

This invention is related generally to a reduced power logic gate, particularly for logic inverter gate.

DESCRIPTION OF THE RELATED ART

FIG. 1 shows an INVERTER gate 10 in the aforementioned continued application. The inverter gate includes a precharge path, a logic path and a control circuit. The precharge path is implemented with a p-channel transistor 12 having a channel connected between an output node 16 and a clock input 14. The control circuit is implemented with a pair of diode-connected transistors, one a p-channel diode 18 and the other an n-channel diode 20, connected in parallel and between the output node 16 and the gate of the precharge transistor 12. The positive side of the n-channel diode 20 and the negative side of the p-channel diode 18 are connected to the gate of the precharge transistor 12.

An n-channel transistor 22 implements the inverter logic function. Transistor 22 has its channel connected between the output node 16 and the clock line 14. The gate of transistor 22 is connected to an input 24 on which the transistor 22 operates to produce an inverted version of a signal at the input 24 on the output node 16.

FIG. 2 shows waveforms depicting the operation of the inverter. The low phase of the clock 14 is the evaluation phase and the high phase of the clock 14 is the precharge phase for the circuit shown in FIG. 2. The output 16 follows the waveform on the clock line 14 when the input to the inverter is high, causing the output 16 to be low during the evaluation phase. The output voltage is maintained at the positive supply voltage, Vdd, when the input is low. For a conventional logic inverter, the logic state of the output is the opposite of the input. Compared with conventional inverters, this low power dynamic inverter operates differently. When the input is high, the output follows the clock instead of staying logic low, as it would in a conventional inverter. This requires defining evaluation phase and precharge phase and these phases limit the application of this circuit when it interfaces with conventional logic gates.

Therefore, there is a need for low power dynamic inverter with an inverter-like output.

BRIEF SUMMARY OF THE INVENTION

The present invention is directed towards the above need. In accordance with the present invention, a low power dynamic inverter includes a precharge circuit, a discharge circuit and an output circuit. The precharge circuit has an input for receiving a clock signal that varies from a high voltage to a low voltage, an input for receiving a data signal and a precharge node. The precharge circuit charges the precharge node to a voltage substantially close to the high voltage of the clock signal when the data signal is a logic low and the high voltage is present on the clock signal. The discharge circuit has an input for receiving the clock signal, an input for receiving the data signal and a discharge node. The discharge circuit discharges the discharge node to a voltage substantially close to the low voltage of the clock signal when the data signal is a logic high and the low voltage is present on the clock signal. The output circuit is connected to the precharge node and the discharge node, and has an input for receiving the data signal and an output node for carrying a value indicative of a logic function performed on the data signal, the output value being derived from either the voltage on the precharge node or the discharge node, depending on whether the data signal is a logic high or a logic low.

A method, in accordance with the present invention, includes charging a precharge node from a clock signal when a data input is low and the clock signal is high and outputting a high voltage on an output node based on the precharge node charge and the low on the data input and discharging a discharge node to a clock signal when the data input is high and the clock signal is low and outputting a low voltage on the output node based on the discharge node charge and the high on the data input.

One advantage of the dynamic inverter of the present invention is low power operation since there is no direct path between Vdd and GND as in a conventional inverter that consumes power during switching. The energy used to precharge to nodes in the inverter to a logic high is recaptured by the clock circuit.

Another advantage is that the output node can drive more logic inputs at a given clock cycle rate.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1:
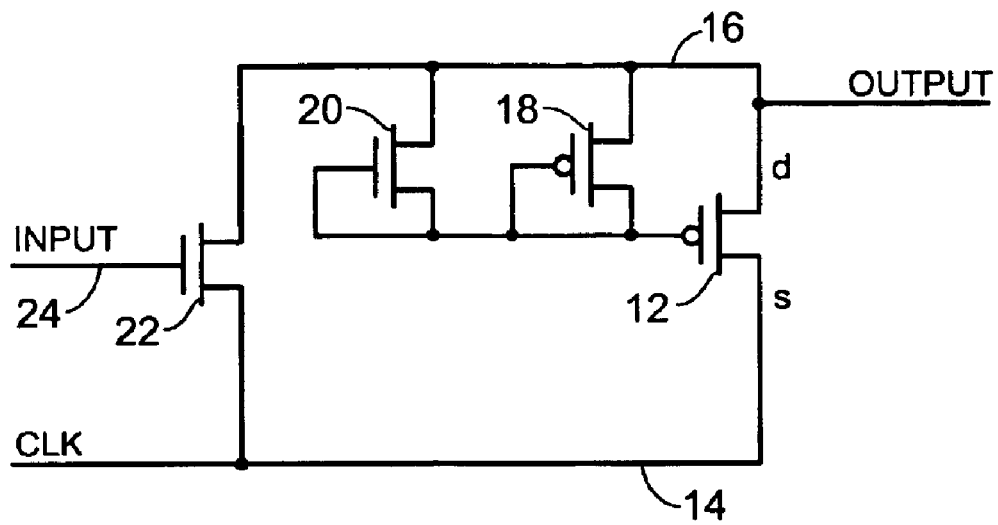
FIG. 1 shows a low power dynamic inverter.
Figure 2:
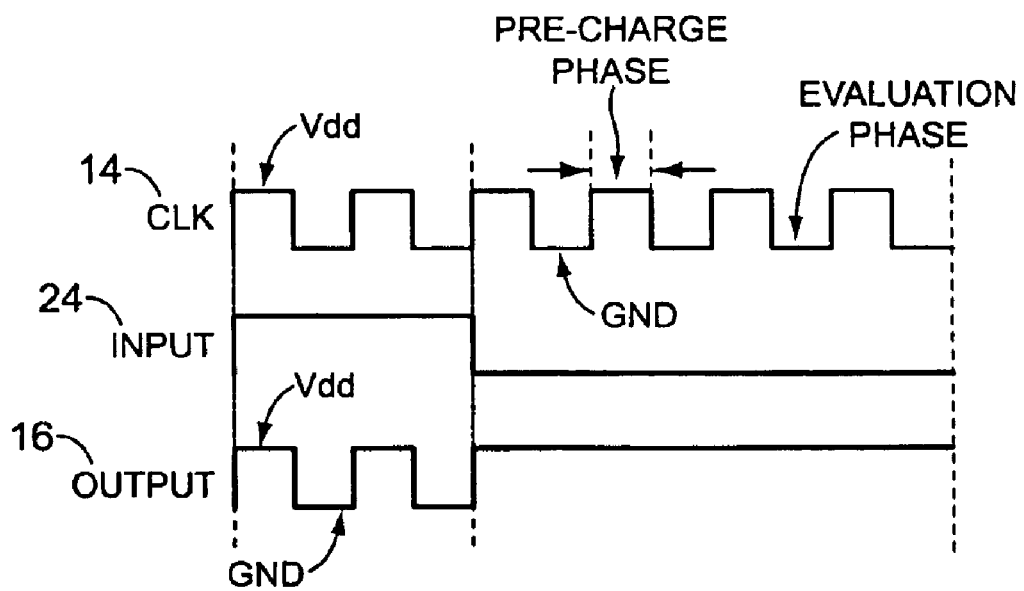
FIG. 2 shows waveforms depicting the operation of an inverter shown in FIG. 1.
Figure 3:
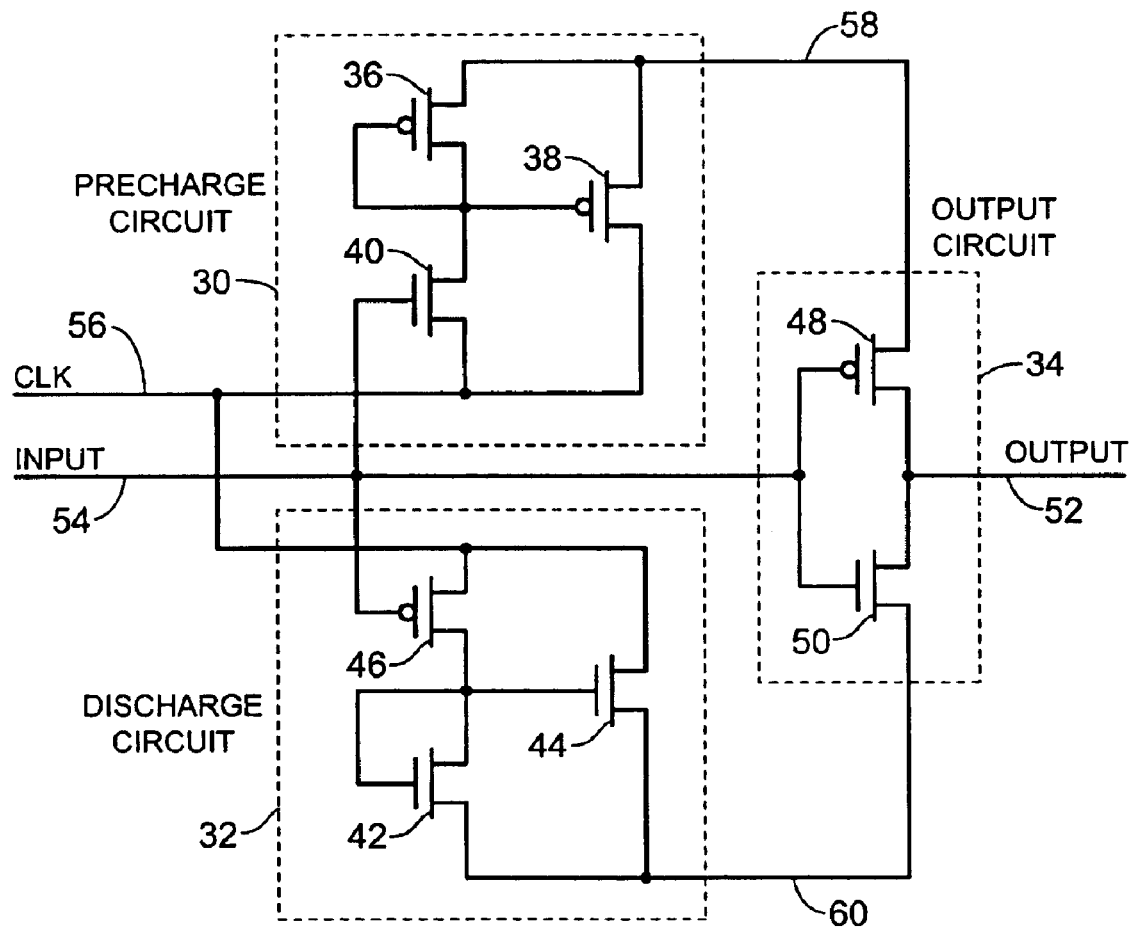
FIG. 3 shows a low power dynamic inverter in accordance with the present invention.

FIG. 3 shows a low power dynamic inverter with an inverter-like output, in accordance with the present invention. The dynamic inverter of the present invention has three parts, a precharge circuit 30, a discharge circuit 32, and output circuit 34. The precharge circuit 30 includes two PMOS transistors 36, 38 and one NMOS transistor 40. The discharge circuit 32 includes two NMOS transistors 42, 44 and one PMOS transistor 46. The output circuit 34 includes a PMOS 48 and an NMOS transistor 50 connected together at a junction which forms the dynamic inverter output 52. The input 54 is connected to the gates of NMOS transistor 40, PMOS transistor 46, PMOS transistor 48 and NMOS transistor 50.

More specifically, the precharge circuit includes a first PMOS transistor 38 having a channel connected between a clock input 56 and a precharge node 58. A second PMOS transistor 36 is configured as a diode which is connected between the gate of the first PMOS transistor 38 and the precharge node 58. The positive side of the second PMOS diode 36 is connected to the precharge node 58. A first NMOS transistor 40 has a channel connected between the gate of the first PMOS transistor 38 and the clock input 56. The gate of the first NMOS transistor 40 is connected to the logic input 54 to be evaluated, in this case, inverted.

The discharge circuit 32 includes a second NMOS transistor 44 having a channel connected between the clock input 56 and a discharge node 60. A third NMOS transistor 42 is configured as a diode which connected between the gate of the second NMOS transistor 44 and the discharge node 60 with the positive side of the diode connected to the gate of transistor 44. A third PMOS transistor 467 has a channel connected between the gate of the second NMOS transistor 44 and the clock input 56. The gate of the third PMOS transistor 46 is connected to the input 54 to be evaluated.

The output circuit 34 includes a fourth NMOS transistor 50 and a fourth PMOS transistor 48. The channel of the fourth PMOS transistor 48 is connected between the output node 52 and the precharge node 58. The channel of the fourth NMOS transistor 50 is connected between the output node 52 and the discharge node 60. The gates of the fourth NMOS transistor 50 and fourth PMOS transistor 48 are connected together and to the input 54 to be evaluated.

The precharge circuit 30 is operative to provide, when the input 54 is a logic low, a voltage $(V_{H-V\delta})$ on the precharge node that is substantially close to a logic high voltage $V_H$ of the waveform on the clock input. The $V_{67}$ voltage is a small voltage drop across the first PMOS transistor when in the constant current region (CCR). This voltage drop is a function of the W/L ratio of the first PMOS transistor 38 and the second PMOS transistor 36. The precharge circuit 30 is also operative to cause the precharge node 58 to follow the waveform on the clock input 56 when the input is high.

The discharge circuit 32 is operative to provide, when the input is a logic high, a voltage $(V_L-V_\delta)$ on the discharge node that is substantially close to the low voltage $V_L$ level of the waveform on the clock input, and operative to cause the discharge node 60 to follow the waveform on the clock input 56 when the input is low 54.

The output circuit 34 is operative to provide, an inversion of the input 54. When the input 54 is high, the output node 52 is low and visa-versa. The precharge circuit 30 and discharge circuit 32 cooperate with the output circuit 34 to provide charge on either the precharge node 58 or the discharge node 60, depending on the state of the input 54, so that the output node 52 has and maintains the proper state, dependent on the input 54.

Figure 4:
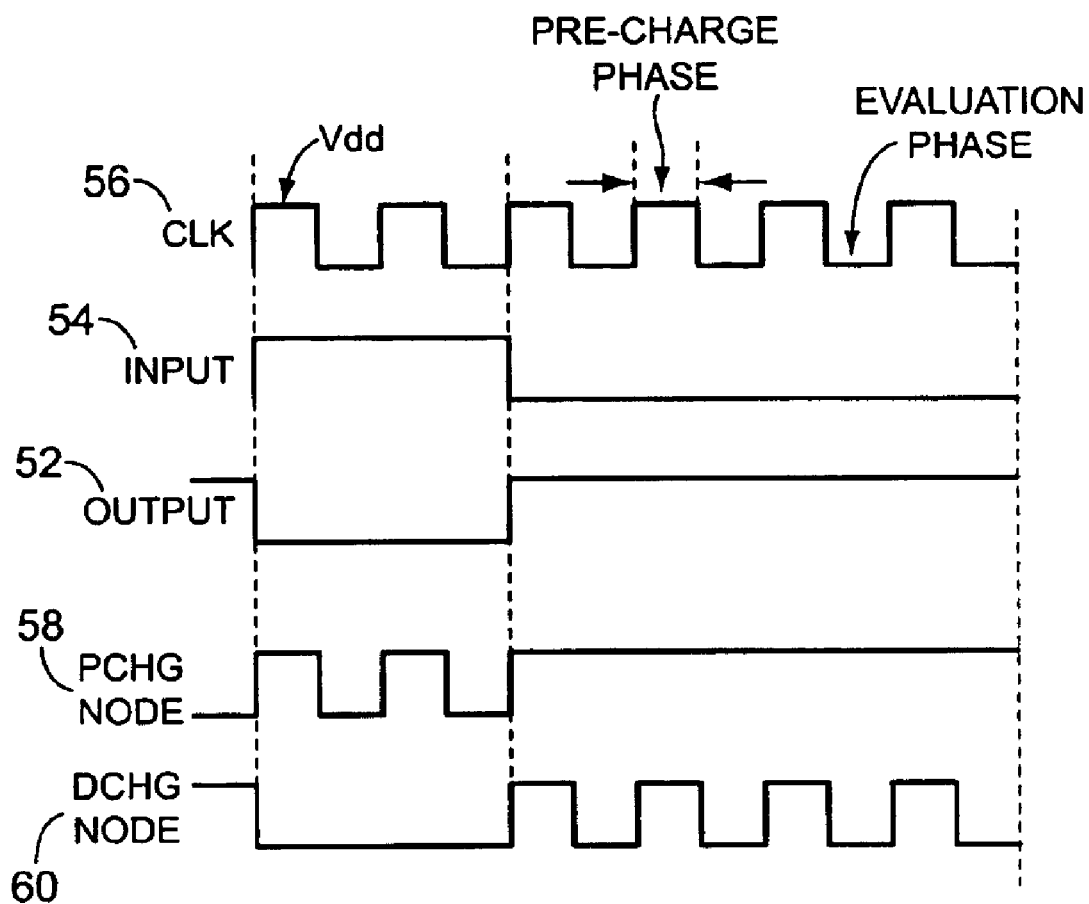
FIG. 4 shows waveforms depicting the operation of the inverter circuit of FIG. 3.

FIG. 4 shows waveforms depicting the operation of the inverter. It can be seen that the logic state of the output 52 is the opposite of the input 54 as in a conventional inverter. The voltage range of the output is approximately equal to the voltage range, $V_H$ to $V_L$, of the clock line, i.e., a full-swing voltage. The clock waveform 56 is not limited to a square wave. Sinusoidal waveforms can also be used for the clock signal.

In more detail, the circuit of FIG. 3 operates as follows. When the input signal 54 to be evaluated is a logic low, the output node 52 becomes a logic high when the precharge node 58 is charged to a voltage close to the logic high value $V_H$ of the waveform on the clock input 56. To charge the precharge node requires that the first PMOS transistor 38 be conductive between the clock input 56 and the precharge node 58. This occurs when the source-to-gate voltage $V_{SG}$ of the first PMOS transistor 38 is positive and exceeds the threshold voltage $V_{tp}$ of the transistor. The second PMOS transistor 36 provides a gate voltage to the first PMOS transistor of approximately $(V_H-V_\delta)-V_{tp}$, where $V_{67}$ is the voltage drop across the first PMOS transistor. With the source of the first PMOS transistor 38 considered to be the terminal connected to the clock input, the minimum source-to-gate voltage $V_{SG}=V_H-((V_H-V_\delta)=V_{tp}+V_\delta$, indicating there is excess gate voltage to turn on and keep on the first PMOS transistor when the input is low and the clock waveform is high. When the waveform on the clock input returns low, the first PMOS transistor turns off because there is no excess gate voltage on the transistor with the source of that transistor now considered to be connected to the precharge node. Thus, when the input is low the precharge node stays charged at or near $(V_H-V_\delta)$ and the output node stays at a logic high.

Continuing with the detailed operation of the circuit, when the input 54 to be evaluated is high, the discharge circuit 32 is operative to discharge the discharge node 60 to a voltage substantially close to the low voltage $V_L$ of the waveform on the clock input so that the fourth NMOS transistor 50 provides a logic low on the output node. While the signal on the input 54 is high and the clock waveform is low $V_L$, the second NMOS transistor 44 is conductive because it has a gate voltage of $(V_L+V_\delta)+V_{tn}$ (due to the third NMOS transistor 42) and a source voltage of $V_L$ (the voltage on the clock input), where $V_\delta$ is the voltage drop across the third NMOS transistor 42 when in the CCR. The minimum gate-to-source voltage is then $(V_\delta+V_{tn})$, indicating there is excess gate voltage to turn on the second NMOS transistor 44 which discharges the discharge node to $(V_L+V_\delta)$. When the clock input 54 returns to a logic high, the second NMOS transistor 44 turns off because the gate-to-source voltage, with the source now considered to be connected to the discharge node 60, is less than or equal to $V_{tn}$.

It should also be pointed out that the conditions under which the precharge circuit 30 is operative to charge the precharge node 58, i.e., when the input 54 is low and the clock input 56 is high, also cause the discharge node 60 to be charged due to the third PMOS transistor 46 becoming conductive and providing an excess gate voltage to the second NMOS transistor 44. When the input is low and the clock input is low, the discharge circuit discharges the charged discharge node 60. Thus, when the input is low, the discharge circuit operates to follow to the clock waveform.

Additionally, the conditions under which the discharge circuit 32 is operative to discharge the discharge node 60, i.e., when the input 54 is high and the clock input 56 is low, also cause the precharge node 58 to be discharged due to the first NMOS transistor 40 becoming conductive and providing an excess gate voltage to the first PMOS transistor 38. If there is charge on the precharge node 58, it will be transferred to the clock input 56 by the first PMOS transistor 38. When the input is high and the clock input 56 is high, the precharge circuit 30 charges the precharge node 58. Thus, when the input 54 is high, the precharge circuit operates to follow the clock waveform with Vt drop via two PMOS diodes.

In summary, when the signal on the input 54 is low, the precharge node 58 is only charged but the discharge node 60 follows the clock waveform on the clock input 56. The output node 52 is high because only the fourth PMOS transistor 48 is conducting. The changes on the discharge node 60 are isolated from the output by the fourth NMOS transistor 50 being non-conductive. When the signal on the input 54 is high, the discharge node 60 is only discharged but the precharge node 58 follows the clock waveform. The output node 42 is low because only the fourth NMOS transistor 50 is conducting. The changes on the precharge node 58 are isolated from the output node 42 by the fourth PMOS transistor 48 being non-conductive.

Figure 5:
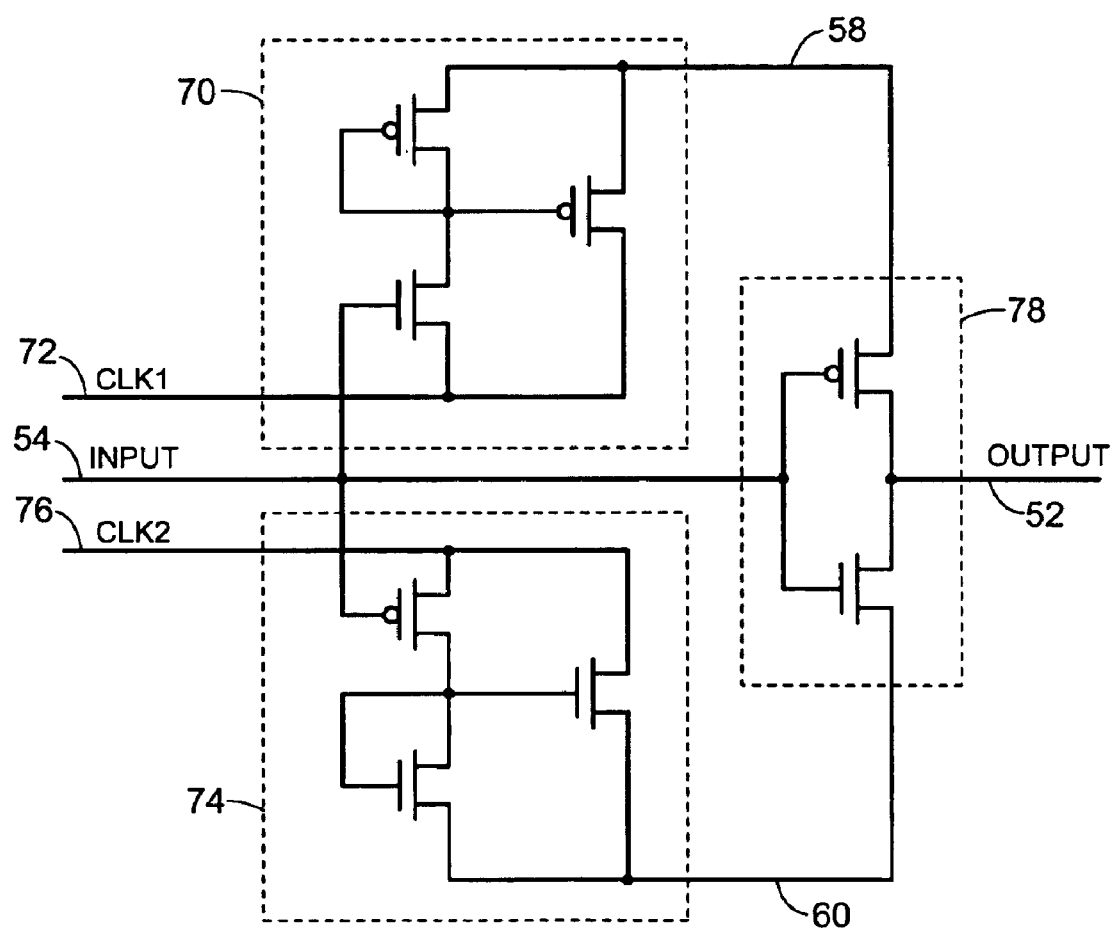
FIG. 5 shows an alternate embodiment of the present invention.
Figure 6A:
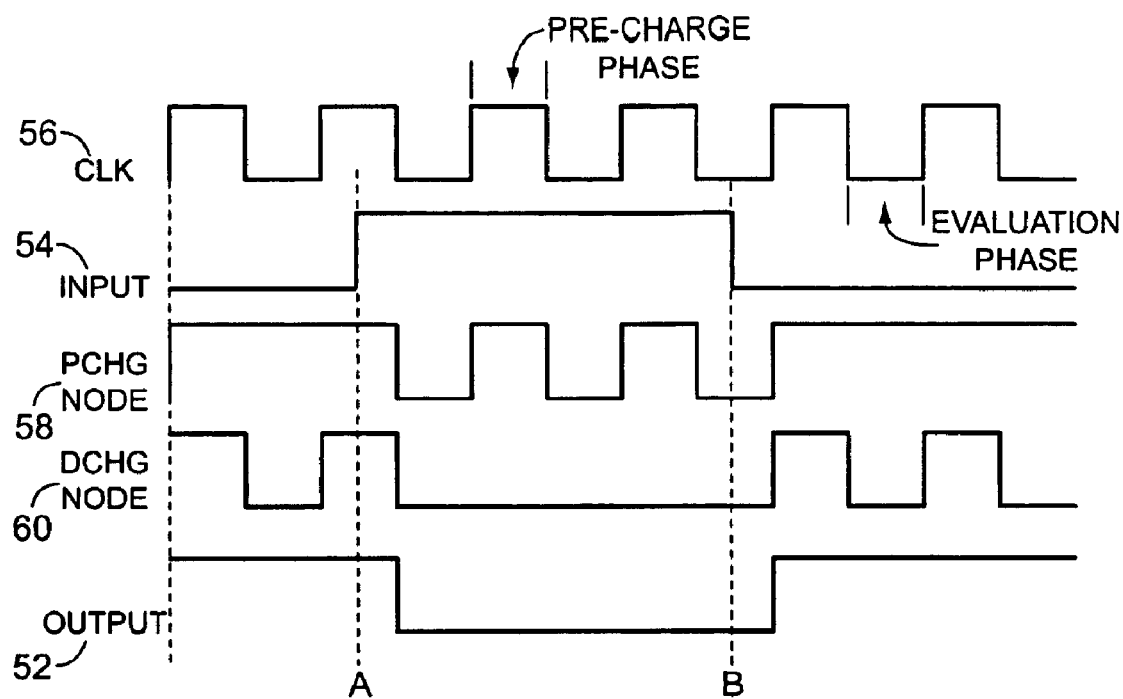
FIG. 6A shows waveforms depicting the operation of the inverter circuit of FIG. 3.
Figure 6B:
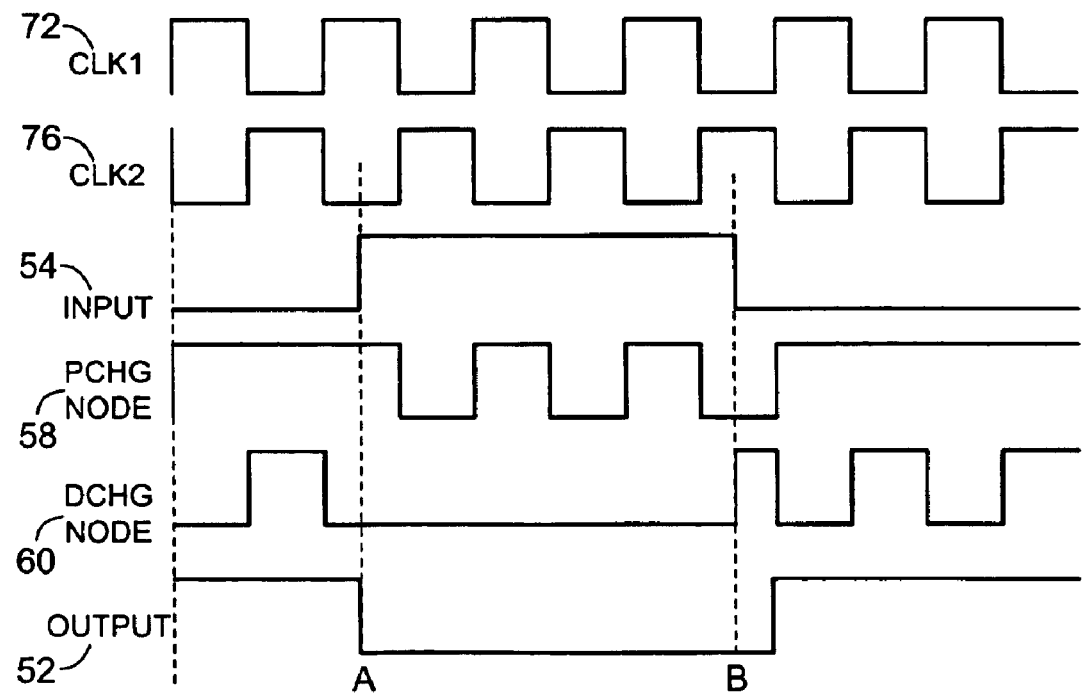
FIG. 6B shows waveforms depicting the operation of the inverter circuit of FIG. 5.

FIG. 5 shows an alternate embodiment of the present invention. In the circuit of FIG. 5, the precharge circuit 70 is connected to a first clock input 72 and the discharge circuit 74 is connected to a second clock input 76. The first clock input 72 and second clock input 76 have non-overlapping clock waveforms, which improves the speed of the circuit. If, as is shown in FIG. 6A, the input voltage is a logic high when the waveform on the clock input is high, (A in the figure), a logic low cannot be generated during that phase of the clock because the discharge circuit has not yet been prepared. The circuit must wait until the clock input is low, to discharge the discharge node 60 thus preparing the output node 52 for a logic low. However, if there are two clocks, as shown in FIG. 6B, both the precharge and discharge nodes are prepared in the same clock phase. This allows the input, regardless of which state it is in, to be evaluated sooner than if there is only one clock.

Figure 7:
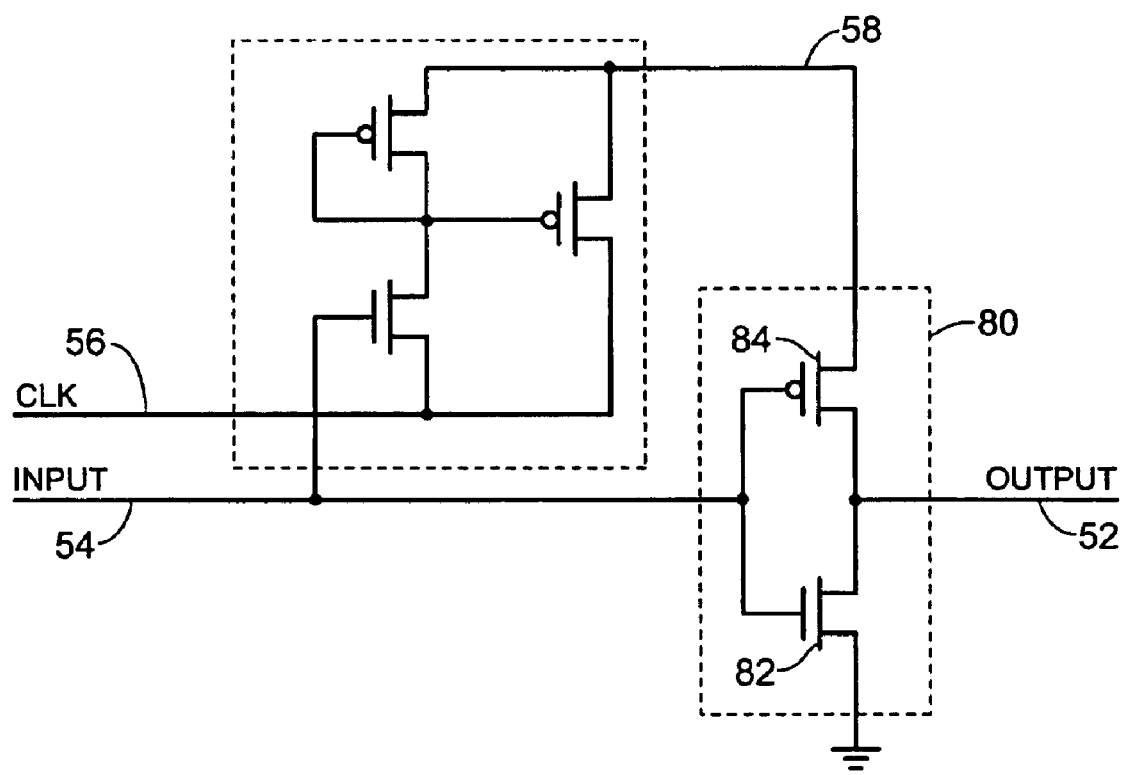
FIG. 7 shows yet another alternative embodiment of the present invention.

FIG. 7 shows yet another alternative embodiment of the present invention. The circuit of FIG. 7 shows an inverter without a discharge circuit. The source of the output NMOS transistor 82 is connected to ground. This configuration also improves the speed of the circuit operation. The disadvantage is that the circuit consumes more power compared to the circuits of FIG. 4 and FIG. 5. Current flow to the ground connection of the NMOS output transistor 82 cannot be transferred to the clock input as occurs in the circuits of FIG. 4 and FIG. 5. In those circuits, because charge on the precharge and discharge node can be transferred back to the clock input, that charge can be reused in the next operation of the circuit, when the clock source is a PicoEngine™ dynamic power supply as described in the above-referenced U.S. patent application Ser. No. 09/967,189, entitled "RESONANT LOGIC AND THE IMPLEMENTATION OF LOW POWER DIGITAL INTEGRATED CIRCUITS."

Although the present invention has been described in considerable detail with reference to certain preferred versions thereof, other versions are possible. Therefore, the spirit and scope of the appended claims should not be limited to the description of the preferred versions contained herein.

What is claimed is:

1. A low power logic gate comprising:
   a precharge circuit having an input for receiving a clock signal that varies from a high voltage to a low voltage, an input for receiving a data signal, and a precharge node, the precharge circuit charging the precharge node to a voltage substantially close to the high voltage of the clock signal when the data signal is a logic low and the high voltage is present on the clock signal;
   a discharge circuit having an input for receiving the clock signal, an input for receiving the data signal, and a discharge node, the discharge circuit discharging the discharge node to a voltage substantially close to the low voltage of the clock signal when the data signal is a logic high and the low voltage is present on the clock signal; and
   an output circuit connected to the precharge node and the discharge node, and having an input for receiving the data signal and an output node for carrying a value indicative of a logic function performed on the data signal, the output value being derived from either the voltage on the precharge node or the discharge node, depending on whether the data signal is a logic high or a logic low.

2. A low power logic circuit as recited in claim 1, wherein the precharge circuit includes:
   a first p-channel transistor having a gate, a source node, and a drain node, and a channel definable between the source and drain nodes, the channel being connected between the precharge node and the clock input;
   a second p-channel transistor having a gate, a source node and a drain node, the gate being connected to the drain to form a diode-connected transistor, a positive side of the diode-connected transistor being connected to the precharge node and a negative side of the diode-connected transistor being connected to the gate of the first p-channel transistor; and
   a first n-channel transistor having a gate, a source node and a drain node, and a channel definable between the source node and drain node, the channel being connected between the gate of the first p-channel transistor and the clock input, the gate of the first n-channel transistor receiving the data input signal.

3. A low power logic circuit as recited in claim 1, wherein the discharge circuit includes:
   a first n-channel transistor having a gate, a source node, and a drain node, and a channel definable between the source and drain nodes, the channel being connected between the discharge node and the clock input;
   a second n-channel transistor having a gate, a source node and a drain node, the gate being connected to the drain to form a diode-connected transistor, a negative side of the diode-connected transistor being connected to the discharge node and a positive side of the diode-connected transistor being connected to the gate of the first n-channel transistor; and
   a first p-channel transistor having a gate, a source node and a drain node, and a channel definable between the source node and drain node, the channel being connected between the gate of the first n-channel transistor and the clock input, the gate of the first p-channel transistor receiving the data input signal.

4. A low power logic circuit as recited in claim 1, wherein the output circuit includes:

a p-channel transistor having a gate, a source node and a drain node, and a channel definable between the source node and the drain node, the channel being connected between the output node and the precharge node; and an n-channel transistor having a gate, a source node and a drain node, and a channel definable between the source node and the drain node, the channel being connected between the output node and the discharge node;

wherein when the data signal is low, the p-channel transistor couples the precharge node to the output node and when the data signal is high, the n-channel transistor couples the discharge node to the output node.

5. A method operating a low power logic circuit, the method comprising:

charging a precharge node from a clock signal when a data input is low and the clock signal is high and outputting a high voltage on an output node based on the precharge node charge and the low on the data input; and discharging a discharge node to the clock signal when the data input is high and the clock signal is low and outputting a low voltage on the output node based on the discharge node charge and the high on the data input.

6. A low power logic gate comprising:

a precharge circuit having an input for receiving a first clock signal that varies from a high voltage to a low voltage, an input for receiving a data signal, and a precharge node, the precharge circuit charging the precharge node to a voltage substantially close to the high voltage of the first clock signal when the data signal is a logic low and the high voltage is present on the first clock signal;

a discharge circuit having an input for receiving a second clock signal that varies from the high voltage to the low voltage, an input for receiving the data signal, and a discharge node, the discharge circuit discharging the discharge node to a voltage substantially close to the low voltage of the second clock signal when the data signal is a logic high and the low voltage is present on the second clock signal; and an output circuit connected to the precharge node and the discharge node, and having an input for receiving the data signal and an output node for carrying a value indicative of a logic function performed on the data signal, the output value being derived from either the voltage on the precharge node or the discharge node, depending on whether the data signal is a logic high or a logic low.

7. A low power logic circuit as recited in claim 6, wherein the precharge circuit includes:

a first p-channel transistor having a gate, a source node, and a drain node, and a channel definable between the source and drain nodes, the channel being connected between the precharge node and the first clock input;

a second p-channel transistor having a gate, a source node and a drain node, the gate being connected to the drain to form a diode-connected transistor, a positive side of the diode-connected transistor being connected to the precharge node and a negative side of the diode-connected transistor being connected to the gate of the first p-channel transistor; and a first n-channel transistor having a gate, a source node and a drain node, and a channel definable between the source node and drain node, the channel being connected between the gate of the first p-channel transistor and the first clock input, the gate of the first n-channel transistor receiving the data input signal.

8. A low power logic circuit as recited in claim 6, wherein the discharge circuit includes:

a first n-channel transistor having a gate, a source node, and a drain node, and a channel definable between the source and drain nodes, the channel being connected between the discharge node and the second clock input;

a second n-channel transistor having a gate, a source node and a drain node, the gate being connected to the drain to form a diode-connected transistor, a negative side of the diode-connected transistor being connected to the discharge node and a positive side of the diode-connected transistor being connected to the gate of the first n-channel transistor; and a first p-channel transistor having a gate, a source node and a drain node, and a channel definable between the source node and drain node, the channel being connected between the gate of the first n-channel transistor and the second clock input, the gate of the first p-channel transistor receiving the data input signal.

9. A low power logic circuit as recited in claim 6, wherein the output circuit includes:

a p-channel transistor having a gate, a source node and a drain node, and a channel definable between the source node and the drain node, the channel being connected between the output node and the precharge node; and an n-channel transistor having a gate, a source node and a drain node, and a channel definable between the source node and the drain node, the channel being connected between the output node and the discharge node;

wherein when the data signal is low, the p-channel transistor couples the precharge node to the output node and when the data signal is high, the n-channel transistor couples the discharge node to the output node.

10. A low power logic circuit as recited in claim 6, wherein the output circuit includes:

a p-channel transistor having a gate, a source node and a drain node, and a channel definable between the source node and the drain node, the channel being connected between the output node and the precharge node; and an n-channel transistor having a gate, a source node and a drain node, and a channel definable between the source node and the drain node, the channel being connected between the output node and the power supply return node;

wherein when the data signal is low, the p-channel transistor couples the precharge node to the output node and when the data signal is high, the n-channel transistor couples the return node to the output node.

11. A method operating a low power logic circuit, the method comprising:

charging a precharge node from a first clock signal when a data input is low and the first clock signal is high and outputting a high voltage on an output node based on the precharge node charge and the low on the data input; and discharging a discharge node to a second clock signal when the data input is high and the second clock signal is low and outputting a low voltage on the output node based on the discharge node charge and the high on the data input.

12. A low power logic gate comprising:

a precharge circuit having an input for receiving a clock signal that varies from a high voltage to a low voltage, an input for receiving a data signal and a precharge node, the precharge circuit charging the precharge node to a voltage substantially close to the high voltage of the clock signal when the data signal is a logic low and the high voltage is present on the clock signal; and an output circuit connected to the precharge node and a power supply return node, and having an input for receiving the data signal and an output node for carrying a value indicative of a logic function performed on the data signal, the output value being derived from either the voltage on the precharge node or the power supply return node, depending on whether the data signal is a logic high or a logic low.

13. A low power logic circuit as recited in claim 12, wherein the precharge circuit includes:

a first p-channel transistor having a gate, a source node, and a drain node, and a channel definable between the source and drain nodes, the channel being connected between the precharge node and the clock input;

a second p-channel transistor having a gate, a source node and a drain node, the gate being connected to the drain to form a diode-connected transistor, a positive side of the diode-connected transistor being connected to the precharge node and a negative side of the diode-connected transistor being connected to the gate of the first p-channel transistor; and a first n-channel transistor having a gate, a source node and a drain node, and a channel definable between the source node and drain node, the channel being connected between the gate of the first p-channel transistor and the clock input, the gate of the first n-channel transistor receiving the data input signal.

14. A method operating a low power logic circuit, the method comprising:

charging a precharge node from a clock signal when a data input is low and the clock signal is high and outputting a high voltage on an output node based on the precharge node charge and the low on the data input; and outputting a low voltage on the output node based on a supply return node voltage and a high on the data input.

* * * * *